United States Patent
Saito

(10) Patent No.: US 9,392,204 B2
(45) Date of Patent: Jul. 12, 2016

(54) IMAGE CAPTURING DEVICE

(71) Applicant: OLYMPUS CORPORATION, Tokyo (JP)

(72) Inventor: Masashi Saito, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/747,265

(22) Filed: Jun. 23, 2015

(65) Prior Publication Data

US 2015/0288906 A1 Oct. 8, 2015

Related U.S. Application Data

(63) Continuation of application No. PCT/JP2014/051768, filed on Jan. 28, 2014.

(30) Foreign Application Priority Data

Feb. 13, 2013 (JP) .................................. 2013-025474

(51) Int. Cl.
*H04N 5/378* (2011.01)
*H04N 5/374* (2011.01)
*H04N 5/357* (2011.01)
(Continued)

(52) U.S. Cl.
CPC .......... *H04N 5/378* (2013.01); *H01L 27/14634* (2013.01); *H01L 27/14636* (2013.01); *H04N 5/3577* (2013.01); *H04N 5/374* (2013.01); *H04N 5/37455* (2013.01); *H04N 2209/041* (2013.01)

(58) Field of Classification Search
USPC ....................................................... 250/208.1
See application file for complete search history.

(56) References Cited

U.S. PATENT DOCUMENTS 7,164,113 B2 * 1/2007 Inokuma .............. H04N 5/2253
250/208.1
7,746,400 B2 * 6/2010 Mo ........................ H04N 5/361
250/208.1
(Continued)

FOREIGN PATENT DOCUMENTS

JP 5-48460 A 2/1993
JP 6-141249 A 5/1994
(Continued)

OTHER PUBLICATIONS

International Search Report dated Apr. 15, 2014, issued in corresponding application No. PCT/JP2014/051768 (1 page).

*Primary Examiner* — Michael Osinski
(74) *Attorney, Agent, or Firm* — Westerman, Hattori, Daniels & Adrian, LLP

(57) ABSTRACT

An image capturing device includes a first substrate and a second substrate that are stacked in stages; a pixel section in the first substrate in which a plurality of pixels outputting signals according to incident physical quantities are disposed in a matrix form; a first AD conversion circuit in the first substrate for every column or every plurality of columns of pixels performing AD conversion on signals output by pixels; a connector that electrically connects the first substrate and the second substrate; a second AD conversion circuit in the second substrate for every column or every plurality of columns of pixels and performing AD conversion on signals output by pixels and inputting through the connector; and a controller in the first substrate or the second substrate and supplying a control signal to the first AD conversion circuit and the second AD conversion circuit.

7 Claims, 6 Drawing Sheets

(51) Int. Cl.
*H04N 5/3745* (2011.01)
*H01L 27/146* (2006.01)

(56) References Cited

U.S. PATENT DOCUMENTS

| | | | | |
|---|---|---|---|---|
| 7,960,197 | B2 * | 6/2011 | Akiyama | H01L 27/14603 257/432 |
| 8,089,543 | B2 * | 1/2012 | Iida | H01L 27/1464 348/294 |
| 8,558,292 | B2 * | 10/2013 | Guidash | H01L 27/14634 257/292 |
| 8,570,417 | B2 * | 10/2013 | Oike | H04N 5/335 250/208.1 |
| 8,704,694 | B2 * | 4/2014 | Kawahito | H04N 5/357 341/155 |
| 8,735,796 | B2 * | 5/2014 | Shimizu | H04N 5/3577 250/208.1 |
| 8,743,248 | B2 * | 6/2014 | Saito | H04N 5/378 348/294 |
| 8,779,343 | B2 * | 7/2014 | Saito | H04N 5/37455 250/208.1 |
| 8,823,847 | B2 * | 9/2014 | Yamashita | H01L 27/1463 348/294 |
| 8,830,368 | B2 * | 9/2014 | Kato | H04N 5/335 257/443 |
| 8,890,989 | B2 * | 11/2014 | Yamashita | H01L 23/481 348/308 |
| 8,896,736 | B2 * | 11/2014 | Kobayashi | H04N 5/23241 348/302 |
| 8,941,765 | B2 * | 1/2015 | Saito | H04N 5/374 250/208.1 |
| 8,947,573 | B2 * | 2/2015 | Sogoh | H01L 27/14609 348/311 |
| 9,055,241 | B2 * | 6/2015 | Nakajima | H04N 5/335 |
| 9,106,860 | B2 * | 8/2015 | Hagihara | H04N 5/378 |
| 9,153,616 | B2 * | 10/2015 | Kondo | H01L 27/14634 |
| 9,157,796 | B2 * | 10/2015 | Shimotsusa | G01J 1/44 |
| 9,219,100 | B2 * | 12/2015 | Yamaguchi | H01L 27/307 |
| 2007/0090274 | A1 * | 4/2007 | Lee | H01L 27/14603 250/208.1 |
| 2008/0211946 | A1 * | 9/2008 | Uchida | H04N 3/1568 348/294 |
| 2009/0040352 | A1 * | 2/2009 | Kawaguchi | G06F 3/044 348/308 |
| 2010/0245647 | A1 * | 9/2010 | Honda | H01L 27/14634 348/308 |
| 2010/0259662 | A1 | 10/2010 | Oike et al. | |
| 2010/0283881 | A1 * | 11/2010 | Araki | H01L 27/14643 348/308 |
| 2011/0221941 | A1 * | 9/2011 | Sato | H04N 5/3742 348/294 |
| 2012/0120290 | A1 * | 5/2012 | Kim | H04N 5/378 348/294 |
| 2012/0293698 | A1 * | 11/2012 | Sukegawa | H01L 25/167 348/294 |
| 2013/0033632 | A1 * | 2/2013 | Kishi | H01L 27/14634 348/308 |
| 2013/0105667 | A1 * | 5/2013 | Kobayashi | H01L 27/14634 250/208.1 |
| 2013/0120622 | A1 * | 5/2013 | Hiraoka | H04N 5/374 348/294 |
| 2014/0246706 | A1 * | 9/2014 | Mori | H01L 27/14609 257/222 |
| 2014/0267858 | A1 * | 9/2014 | Ohtsuki | H04N 5/3745 348/302 |

FOREIGN PATENT DOCUMENTS

| | | |
|---|---|---|
| JP | 2008-92091 A | 4/2008 |
| JP | 2008-252605 A | 10/2008 |
| JP | 2009-212621 A | 9/2009 |
| JP | 2010-245955 A | 10/2010 |

\* cited by examiner

IMAGE CAPTURING DEVICE

CROSS REFERENCE TO RELATED APPLICATIONS

This application is a continuation application based on a PCT Patent Application No. PCT/JP2014/051768, filed Jan. 28, 2014, whose priority is claimed on Japanese Patent Application No. 2013-025474, filed Feb. 13, 2013, the entire content of which are hereby incorporated by reference.

BACKGROUND OF THE INVENTION

1. Field of the Invention

The present invention relates to an image capturing device.

2. Description of the Related Art

In recent years, solid-state image capturing devices represented by a charge coupled device (CCD) image sensor (referred to as a CCD below) and a complementary metal oxide semiconductor (CMOS) image sensor (referred to as a CMOS below) have been mounted on image capturing devices represented by a digital still camera, a camcorder, and an endoscope. These solid-state image capturing devices have become common both in and out of Japan, and demands for miniaturization and low power consumption are further increasing.

Among such solid-state image capturing devices, particularly among CMOS-type solid-state image capturing devices, a so-called column analog-digital (AD) type solid-state image capturing device which has AD conversion functions built in a column section has been developed and commercialized. According to a single-slope AD conversion scheme, which is one of the built-in AD conversion functions, an analog pixel signal and a reference signal (ramp wave) which is intended to be converted into a digital signal and changes monotonically are compared, and count processing is performed in parallel with this comparison processing, so that a digital signal of the pixel signal is acquired based on a count value at a point in time at which the comparison processing is completed.

Also, a top-bottom read type CMOS image sensor is known, e.g., Japanese Unexamined Patent Application, First Publication No. 2009-212621 (hereinafter referred to as Patent Literature 1) and Japanese Unexamined Patent Application, First Publication No. 2008-252605 (hereinafter referred to as Patent Literature 2). FIG. 5 is a block diagram showing a configuration of a top-bottom read type CMOS image sensor disclosed in Patent Literature 1. In this example, the CMOS image sensor provides a column processing section 107a (AD conversion circuit) above a pixel array section, and provides a column processing section 107b (AD conversion circuit) below the pixel array section, so that alternate pixel columns receive a pixel signal from the upper and lower AD conversion circuits.

FIG. 6 is a block diagram showing a configuration of a top-bottom read type CMOS image sensor disclosed in Patent Literature 2. In this example, the CMOS image sensor has column processing sections 50A and 50B (AD conversion circuits) disposed on both upper and lower sides of a pixel array section 300, so that, for example, pixel signals of odd-numbered rows of the pixel array section 300 are read and processed by the column processing section 50A (AD conversion circuit) on the lower side and pixel signals of even-numbered rows are read and processed by the column processing section 50B (AD conversion circuit) on the upper side.

An AD conversion circuit having a counter which generates a lower phase shift clock using a ring oscillator or the like having a plurality of delay sections having the same configuration and starting a transition operation at a timing related to the start of comparison processing, and counts a pulse from the ring oscillator, a lower latch section which latches lower logic states that are logic states of the plurality of delay sections at a first timing related to the end of the comparison processing, and an upper latch section which latches an upper logic state that is a logic state of the counter at the first timing related to the end of the comparison processing, and performing AD conversion by calculating a digital signal according to an analog signal based on data of the lower latch section and the upper latch section is known, e.g. Japanese Unexamined Patent Application, First Publication No. 2008-92091 (hereinafter referred to as Patent Literature 3).

SUMMARY

According to a first aspect of the present invention, an image capturing device in which a first substrate and a second substrate are stacked in stages includes: a pixel section which is configured in the first substrate and in which a plurality of pixels outputting signals according to incident physical quantities are disposed in a matrix form; a first analog-digital (AD) conversion circuit which is disposed in the first substrate for every column or every plurality of columns of pixels and performs AD conversion on signals output by at least some of the pixels; a connector which electrically connects the first substrate and the second substrate; a second AD conversion circuit which is disposed in the second substrate for every column or every plurality of columns of pixels and performs AD conversion on signals output by at least some of the pixels and input through the connector; and a controller which is configured in the first substrate or the second substrate and supplies a control signal to the first AD conversion circuit and the second AD conversion circuit. An area of the first substrate in which the first AD conversion circuit is disposed and an area of the second substrate in which the second AD conversion circuit is disposed overlap at least partially.

According to a second aspect of the present invention, in the image capturing device relating to the first aspect, the controller may have a clock generator which outputs a multiphase clock signal, and the first AD conversion circuit and the second AD conversion circuit may perform the AD conversion using the multiphase clock signal output by the clock generator.

According to a third aspect of the present invention, in the image capturing device relating to the first aspect or the second aspect, the first AD conversion circuit may perform the AD conversion on signals output by pixels of odd-numbered columns or odd-numbered pixels, or pixels of even-numbered columns or even-numbered pixels, and the second AD conversion circuit may perform the AD conversion on signals output by pixels of columns different from the pixels on which the first AD conversion circuit performs the AD conversion.

According to a fourth aspect of the present invention, in the image capturing device relating to the first aspect or the second aspect, the first AD conversion circuit may perform the AD conversion on signals output by pixels of odd-numbered rows or even-numbered rows, and the second AD conversion circuit may perform the AD conversion on signals output by pixels of rows different from the pixels on which the first AD conversion circuit performs the AD conversion.

According to a fifth aspect of the present invention, the image capturing device relating to the first aspect may be an image capturing device in which the first substrate, the second substrate, and a third substrate are stacked in stages, the connector may electrically connect the first substrate, the second substrate, and the third substrate, the image capturing device may further include a third AD conversion circuit which is disposed in the third substrate for every column or every plurality of columns of pixels and performs AD conversion on signals output by at least some of the pixels and input through the connector, and an area of the first substrate in which the first AD conversion circuit is disposed, an area of the second substrate in which the second AD conversion circuit is disposed, and an area of the third substrate in which the third AD conversion circuit is disposed overlap at least partially.

DETAILED DESCRIPTION OF THE PREFERRED EMBODIMENTS (First Embodiment)

Figure 1:
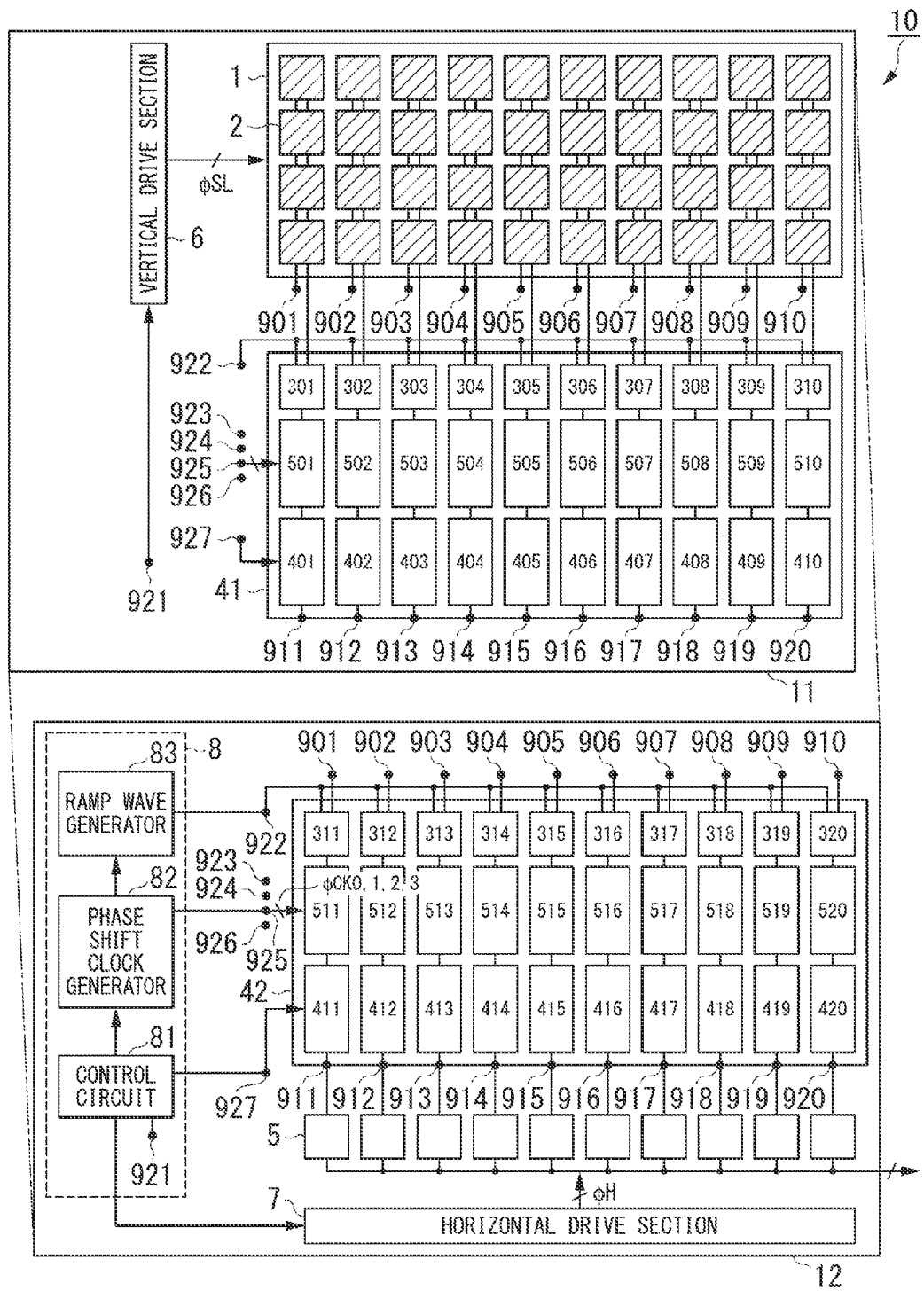
FIG. 1 is a block diagram showing a schematic configuration of an image capturing device according to a first embodiment of the present invention.

Hereinafter, a first embodiment of the present invention will be described with reference to drawings. FIG. 1 is a block diagram showing a schematic configuration of an image capturing device according to this embodiment. In the example shown in the drawing, an image capturing device 10 includes a first substrate 11 (a primary substrate) and a second substrate 12 (a secondary substrate), and the first substrate 11 and the second substrate 12 are stacked in stages. In other words, the first substrate 11 and the second substrate 12 overlap. The image capturing device 10 includes a pixel section 1 in which a total of 40 pixels 2 are disposed in a matrix form of four rows and ten columns, a first analog-digital (AD) conversion circuit 41, a second AD conversion circuit 42, a memory 5, a vertical drive section 6, a horizontal drive section 7, a controller 8, and connectors 901 to 927.

The first AD conversion circuit 41 provides the respective columns of pixels 2 with comparators 301 to 310, latches 501 to 510, and counters 401 to 410. The second AD conversion circuit 42 provides the respective columns of pixels 2 with comparators 311 to 320, latches 511 to 520, and counters 411 to 420. The controller 8 includes a control circuit 81, a phase shift clock generator 82 (clock generator), and a ramp wave generator 83.

In the first substrate 11, the pixel section 1, the first AD conversion circuit 41, and the vertical drive section 6 are configured. In the second substrate 12, the second AD conversion circuit 42, the memory 5, the horizontal drive section 7, and the controller 8 are configured. An area of the first substrate 11 in which the first AD conversion circuit 41 is disposed and an area of the second substrate 12 in which the second AD conversion circuit 42 is disposed overlap at least partially.

The connectors 901 to 927 electrically connect the first substrate 11 and the second substrate 12. For example, the connector 901 electrically connects outputs of pixels 2 of a first column configured in the first substrate 11 and an input of the comparator 301 included in the second AD conversion circuit 42 configured in the second substrate 12. In addition, connection relationships of the connectors 902 to 927 are as shown in the drawing.

The comparators 301 to 310 included in the first AD conversion circuit 41 are configured so that output values of pixels 2 of the corresponding columns and the odd-numbered rows are input. For example, the comparator 301 included in the first AD conversion circuit 41 is configured so that output values of pixels 2 of a first column and the odd-numbered rows are input. Also, the comparators 311 to 320 included in the second AD conversion circuit 42 are configured so that output values of pixels 2 of the corresponding columns and the even-numbered rows are input. For example, the comparator 311 included in the second AD conversion circuit 42 is configured so that output values of pixels 2 of a first column and the even-numbered rows are input. In other words, the first AD conversion circuit 41 performs AD conversion (analog-digital conversion) on output values of pixels 2 of odd-numbered rows, and the second AD conversion circuit 42 performs AD conversion (analog-digital conversion) on output values of pixels 2 of even-numbered rows.

The pixels 2 output pixel signals according to incident light quantities (physical quantities). The first AD conversion circuit 41 operates the comparators 301 to 310, the latches 501 to 510, and the counters 401 to 410, converting the pixel signals input from the pixels 2 into digital pixel signals. The second AD conversion circuit 42 operates the comparators 311 to 320, the latches 511 to 520, and the counters 411 to 420, converting the pixel signals input from the pixels 2 into digital pixel signals. The vertical drive section 6 changes a vertical signal φSL, thereby selecting pixels 2 outputting signals in every row from among the pixels 2 disposed in a matrix form. The memory 5 temporarily stores the digital pixel signals converted by the first AD conversion circuit 41 and the second AD conversion circuit 42. The horizontal drive section 7 changes a horizontal signal φH, thereby sequentially outputting the digital pixel signals temporarily stored in the memory 5 to the outside.

The controller 8 controls respective components included in the image capturing device 10. Specifically, the control circuit 81 outputs a control signal to control respective components included in the image capturing device 10. The phase shift clock generator 82 generates a multiphase clock signal according to the control signal from the control circuit 81 and outputs the generated multiphase clock signal. For example, the phase shift clock generator 82 generates a phase shift pulse φCK0, a phase shift pulse φCK1, a phase shift pulse φCK2, and a phase shift pulse φCK3 whose phases have been shifted by π/8 each according to the control signal from the control circuit 81, and outputs the generated phase shift pulses φCK0 to φCK3. The ramp wave generator 83 generates a ramp signal (a reference signal or a ramp wave) which increases or decreases over time and outputs the generated ramp signal.

In the example shown in the drawing, the pixel section 1 includes the total of 40 pixels 2 in four rows and ten columns. However, the arrangement of pixels is not limited to this and may be any arrangement. Also, the first AD conversion circuit 41 and the second AD conversion circuit 42 provide one column of pixels 2 with one of the comparators 301 to 320, one of the latches 501 to 520, and one of the counters 401 to 420, but the present invention is not limited to this case. The first AD conversion circuit 41 and the second AD conversion circuit 42 may provide a plurality of columns of pixels 2 with one of the comparators 301 to 320, one of the latches 501 to 520, and one of the counters 401 to 420, for example, two columns of pixels 2 with one comparator, one latch, and one counter, three columns of pixels 2 with one comparator, one latch, and one counter, or the like.

Figure 2:
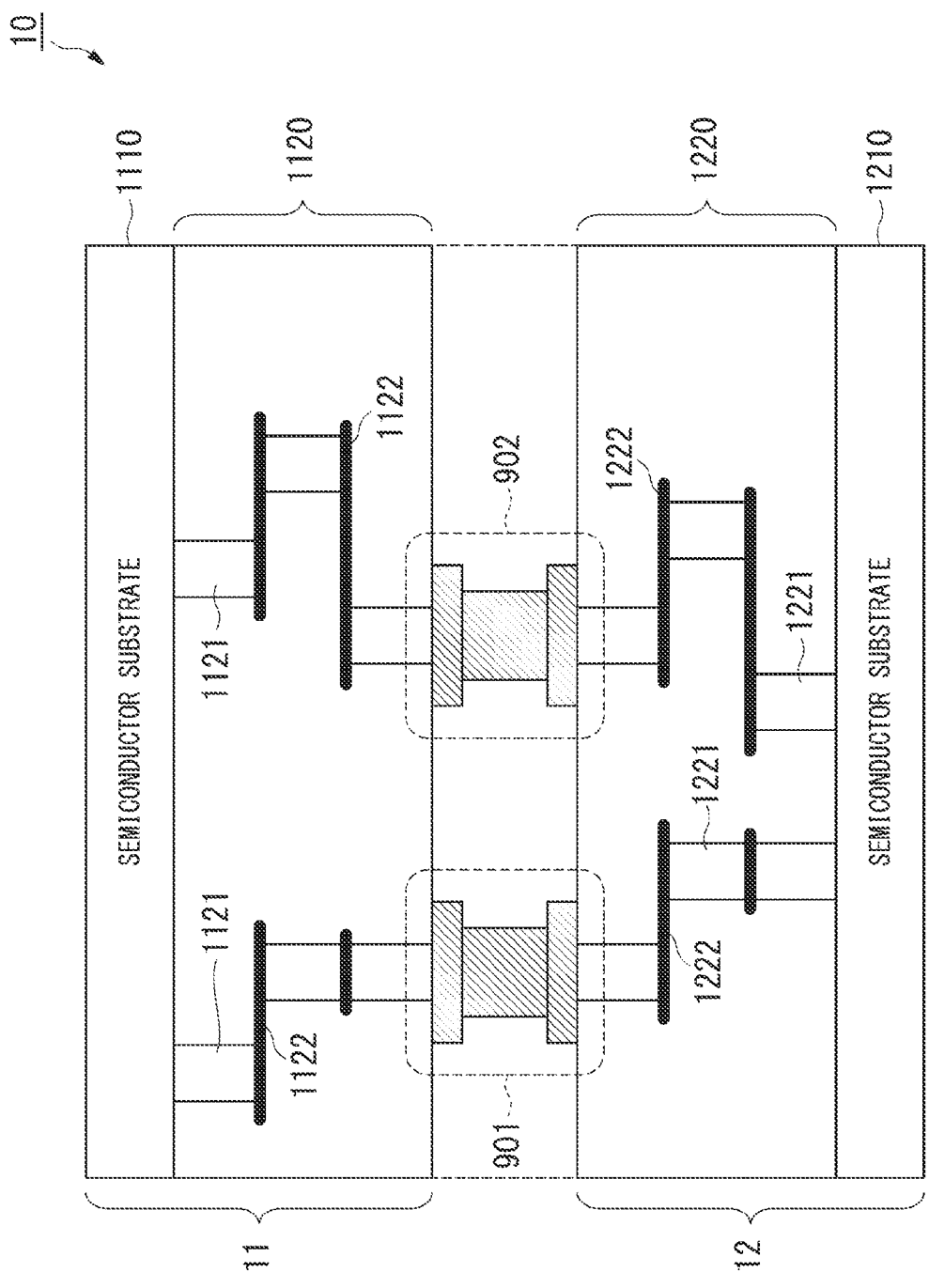
FIG. 2 is a cross-sectional view of a part of the image capturing device according to a first embodiment of the present invention.

Next, a configuration of the connectors 901 to 927 will be described. FIG. 2 is a cross-sectional view of a part of the image capturing device 10 according to this embodiment. In the example shown in the drawing, the first substrate 11, the second substrate 12, the connectors 901 and 902 are shown. The first substrate 11 includes a semiconductor substrate 1110 and a first-substrate wiring layer 1120. The first-substrate wiring layer 1120 includes vias or contacts 1121 and wirings 1122. The vias or contacts 1121 and the wirings 1122 electrically connect a surface of the semiconductor substrate 1110 and a surface of the first-substrate wiring layer 1120.

The second substrate 12 includes a semiconductor substrate 1210 and a second-substrate wiring layer 1220. The second-substrate wiring layer 1220 includes vias or contacts 1221 and wirings 1222. The vias or contacts 1221 and the wirings 1222 electrically connect a surface of the semiconductor substrate 1210 and a surface of the second-substrate wiring layer 1220.

The connectors 901 and 902 are, for example, bumps, and electrically connect the vias or contacts 1121 exposed on the surface of the first-substrate wiring layer 1120 and the vias or contacts 1221 exposed on the surface of the second-substrate wiring layer 1220. With this configuration, it is possible to electrically connect the semiconductor substrate 1110 of the first substrate 11 and the semiconductor substrate 1210 of the second substrate 12. Also, a configuration of the connectors 903 to 927 is the same as the configuration of the connectors 901 and 902. The configuration of the connectors 901 to 927 is not limited to that shown in FIG. 2, and may be any configuration in which the first substrate 11 and the second substrate 12 can be electrically connected.

Next, an operation of the first AD conversion circuit 41 and the second AD conversion circuit 42 will be described in detail. Pixel signals output by pixels 2 disposed in the corresponding columns and the odd-numbered rows, and a ramp signal which is output by the ramp wave generator 83 and whose voltage is changed (increases or decreases) in approximate synchronization with logic states of the counters 401 to 410 are input to the comparators 301 to 310 included in the first AD conversion circuit 41. Pixel signals output by pixels 2 disposed in the corresponding columns and the even-numbered rows, and a ramp signal which is output by the ramp wave generator 83 and whose voltage is changed (increases or decreases) in approximate synchronization with logic states of the counters 411 to 420 are input to the comparators 311 to 320 included in the second AD conversion circuit 42.

When pixel signals are input, the comparators 301 to 320 start comparing the input pixel signals with a ramp signal. Upon this, the counters 401 to 420 start counting. At the same time at which the counters 401 to 420 start counting, the phase shift clock generator 82 inputs the phase shift pulses φCK0, φCK1, φCK2, and φCK3 which are used to determine lower logic states to the latches 501 to 520.

Subsequently, the latches 501 to 520 output a pulse φCK0' to the counters 401 to 420 disposed in the corresponding columns according to, for example, the phase shift pulse φCK0 output by the phase shift clock generator 82.

Subsequently, when magnitude relations between the input pixel signals and the input ramp signal are changed (become a predetermined relation), the comparators 301 to 320 invert values output to the latches 501 to 520. When the values input from the comparators 301 to 320 are inverted, the latches 501 to 520 keep input logic states. When the latches 501 to 520 keep the input logic states, the counters 401 to 420 keep count values.

At this time, the ramp signal input to the comparators 301 to 320, a timing at which the latches 501 to 520 keep the input logic states, and a timing at which the counters 401 to 420 keep the count values are approximately synchronized. Therefore, pixel signals which are targets of A/D conversion are subjected to A/D conversion into values kept in the latches 501 to 520 and the counters 401 to 420.

In the example described above, the phase shift clock generator 82 outputs four kinds of phase shift pulses, which are the phase shift pulses φCK0, φCK1, φCK2, and φCK3, having different phases, but the phase shift pulses are not limited to these. For example, the phase shift clock generator 82 may be configured to output a first phase shift pulse to an n-th phase shift pulse (n is a natural number larger than 1) as two or more kinds of phase shift pulses having different phases. In this case, the image capturing device 10 includes connectors for inputting the first phase shift pulse to the n-th phase shift pulse from the phase shift clock generator 82 configured in the second substrate 12 to the first AD conversion circuit 41 configured in the first substrate 11.

As described above, the first substrate 11 and the second substrate 12 are electrically connected by the connectors 901 to 927. For this reason, it is possible to input, for example, the phase shift pulses φCK0, φCK1, φCK2, and φCK3 output by the phase shift clock generator 82 configured in the second substrate 12 and a ramp signal output by the ramp wave generator 83 to the first AD conversion circuit 41 configured in the first substrate 11. Also, it is possible to input outputs of the pixels 2 configured in the first substrate 11 to the second AD conversion circuit 42 configured in the second substrate 12.

Consequently, respective components included in the image capturing device 10 can be distributed and disposed in the first substrate 11 and the second substrate 12. Also, an area of the first substrate 11 in which the first AD conversion circuit 41 is disposed and an area of the second substrate 12 in which the second AD conversion circuit 42 is disposed can be disposed to overlap at least partially. In other words, it is possible to dispose the first AD conversion circuit 41 and the second AD conversion circuit 42 near each other.

Therefore, it is possible to shorten and approximately equalize a wiring between the first AD conversion circuit 41 and outputs of the respective columns of pixels 2 and a wiring between the second AD conversion circuit 42 and outputs of the respective columns of pixels 2. Also, it is possible to shorten and approximately equalize a wiring between the first AD conversion circuit 41 and the ramp wave generator 83 and a wiring between the second AD conversion circuit 42 and the ramp wave generator 83. Also, it is possible to shorten and approximately equalize a wiring between the first AD conversion circuit 41 and the phase shift clock generator 82 and a wiring between the second AD conversion circuit 42 and the phase shift clock generator 82. Also, it is possible to shorten and approximately equalize a wiring between the first AD conversion circuit 41 and the control circuit 81 and a wiring between the second AD conversion circuit 42 and the control circuit 81.

Consequently, without providing two ramp wave generators 83, two phase shift clock generators 82, or two control circuits 81, it is possible to prevent an increase in noise and the degradation of accuracy caused by extension of a wiring. In other words, while suppressing an increase in circuit size and power consumption, it is possible to prevent an increase in noise and degradation in accuracy of AD conversion caused by a wiring.

In the image capturing device 10 according to this embodiment, the first AD conversion circuit 41 and the second AD conversion circuit 42 provide the respective columns of pixels 2 with the comparators 301 to 320, the latches 501 to 520, and the counters 401 to 420. Also, the first AD conversion circuit 41 performs AD conversion on pixel signals output by the pixels 2 of odd-numbered rows, and the second AD conversion circuit 42 performs AD conversion on pixel signals output by the pixels 2 of even-numbered rows. Consequently, AD conversion of pixel signals output by the pixels 2 of odd-numbered rows and AD conversion of pixel signals output by the pixels 2 of even-numbered rows can be processed in parallel, and it is possible to perform AD conversion on pixels signals of one frame at a high speed.

Here, the first AD conversion circuit 41 may be configured to perform AD conversion on pixel signals output by the pixels 2 of even-numbered rows, and the second AD conversion circuit 42 may be configured to perform AD conversion on pixel signals output by the pixels 2 of odd-numbered rows.

The arrangement of respective components included in the image capturing device 10 is not limited to the arrangement of FIG. 1. For example, the ramp wave generator 83, the phase shift clock generator 82, the control circuit 81, the horizontal drive section 7, or the memory 5 may be disposed on the first substrate 11.

(Second Embodiment)

Figure 3:
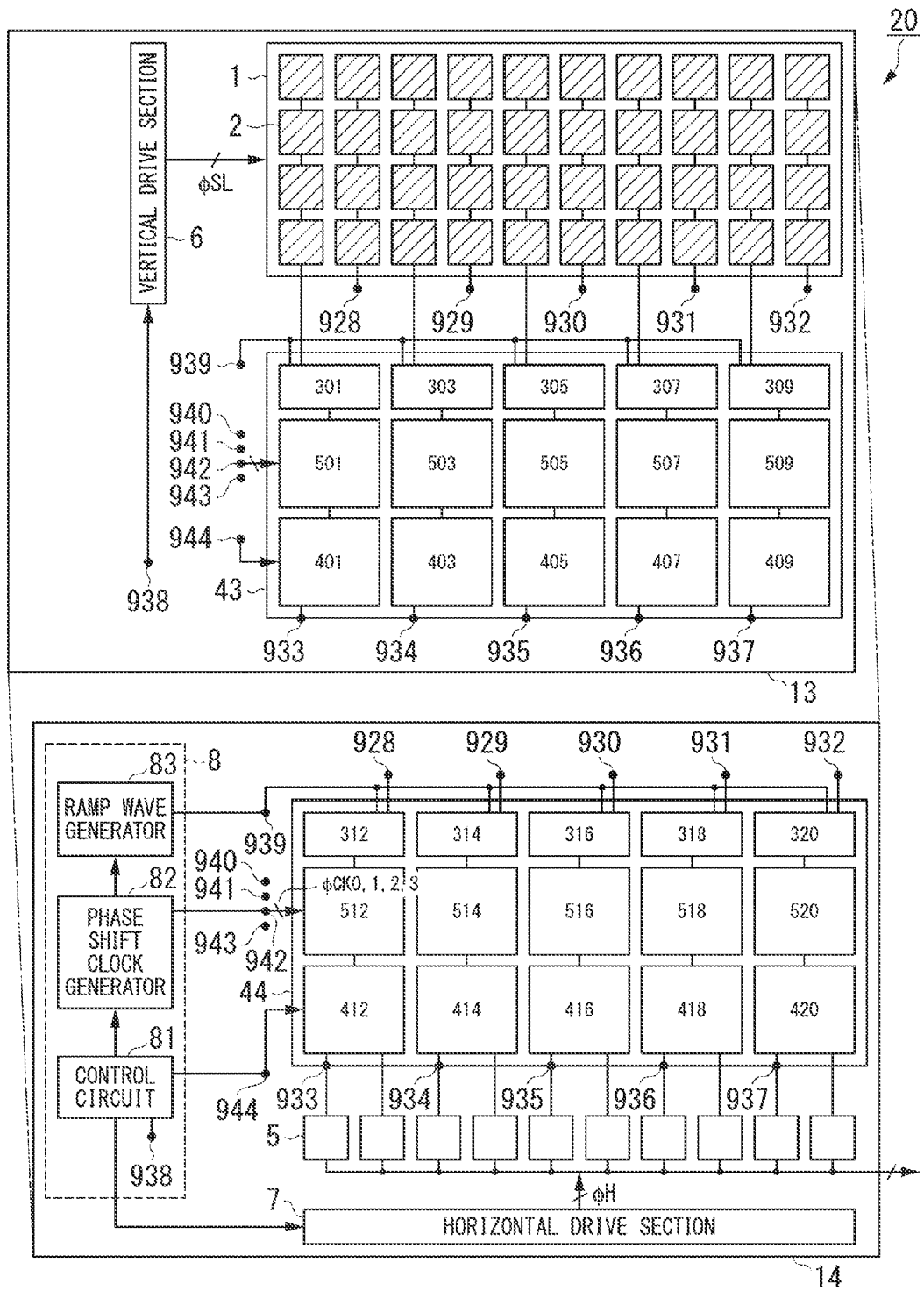
FIG. 3 is a block diagram showing a schematic configuration of an image capturing device according to a second embodiment of the present invention.

Next, an image capturing device according to a second embodiment of the present invention will be described. FIG. 3 is a block diagram showing a schematic configuration of an image capturing device 20 according to this embodiment. In the example shown in the drawing, the image capturing device 20 includes a first substrate 13 and a second substrate 14, and the first substrate 13 and the second substrate 14 are stacked in stages. In other words, the first substrate 13 and the second substrate 14 overlap. The image capturing device 20 includes a pixel section 1 in which a total of 40 pixels 2 are disposed in a matrix form of four rows and ten columns, a first AD conversion circuit 43, a second AD conversion circuit 44, a memory 5, a vertical drive section 6, a horizontal drive section 7, a controller 8, and connectors 928 to 944.

Differences between the image capturing device 20 according to this embodiment and the image capturing device 10 according to the first embodiment are in the configurations of the first AD conversion circuit 43 and the second AD conversion circuit 44 and the number of connectors 928 to 944. Other configurations are the same as those of the image capturing device 10 according to the first embodiment. Therefore, only different components will be described below, and descriptions of configurations that are the same as those of the first embodiment will be omitted.

The first AD conversion circuit 43 provides the respective odd-numbered columns of pixels 2 with comparators 301, 303, 305, 307, and 309, latches 501, 503, 505, 507, and 509, and counters 401, 403, 405, 407, and 409. The second AD conversion circuit 44 provides the respective even-numbered columns of pixels 2 with comparators 312, 314, 316, 318, and 320, latches 512, 514, 516, 518, and 520, and counters 412, 414, 416, 418, and 420.

In the first substrate 13, the pixel section 1, the first AD conversion circuit 43, and the vertical drive section 6 are configured. In the second substrate 14, the second AD conversion circuit 44, the memory 5, the horizontal drive section 7, and the controller 8 are configured. An area of the first substrate 13 in which the first AD conversion circuit 43 is disposed and an area of the second substrate 14 in which the second AD conversion circuit 44 is disposed overlap at least partially.

The connectors 928 to 944 electrically connect the first substrate 13 and the second substrate 14. For example, the connector 928 electrically connects outputs of pixels 2 of a second column configured in the first substrate 13 and an input of the comparator 312 included in the second AD conversion circuit 44 configured in the second substrate 14. In addition, connection relationships of the connectors 928 to 944 are as shown in the drawing.

The comparators 301, 303, 305, 307, and 309 included in the first AD conversion circuit 43 are configured so that output values of pixels 2 of the corresponding odd-numbered columns are input. For example, the comparator 301 included in the first AD conversion circuit 43 is configured so that output values of pixels 2 of a first column are input. Also, the comparators 312, 314, 316, 318, and 320 included in the second AD conversion circuit 44 are configured so that output values of pixels 2 of the corresponding even-numbered columns are input. For example, the comparator 312 included in the second AD conversion circuit 44 is configured so that output values of pixels 2 of a second column are input. In other words, the first AD conversion circuit 43 performs AD conversion on output values of pixels 2 of odd-numbered columns, and the second AD conversion circuit 44 performs AD conversion on output values of pixels 2 of even-numbered columns.

In the example shown in the drawing, the pixel section 1 includes the total of 40 pixels 2 in four rows and ten columns. However, the arrangement of pixels is not limited to this and may be any arrangement. Also, the first AD conversion circuit 43 and the second AD conversion circuit 44 provide two columns of pixels 2 with one of the comparators 301, 303, 305, 307, 309, 312, 314, 316, 318 and 320, one of the latches 501, 503, 505, 507, 509, 512, 514, 516, 518, and 520, and one of the counters 401, 403, 405, 407, 409, 412, 414, 416, 418, and 420, but the present invention is not limited to this case. The first AD conversion circuit 43 and the second AD conversion circuit 44 may provide a plurality of columns of pixels 2 with one of the comparators 301, 303, 305, 307, 309, 312, 314, 316, 318 and 320, one of the latches 501, 503, 505, 507, 509, 512, 514, 516, 518, and 520, and one of the counters 401, 403, 405, 407, 409, 412, 414, 416, 418, and 420, for example, three columns of pixels 2 with one comparator, one latch, and one counter, four columns of pixels 2 with one comparator, one latch, and one counter, or the like.

In this embodiment, the first substrate 13 and the second substrate 14 are electrically connected by the connectors 928 to 944. For this reason, it is possible to input, for example, phase shift pulses φCK0, φCK1, φCK2, and φCK3 output by the phase shift clock generator 82 configured in the second substrate 14 and a ramp signal output by the ramp wave generator 83 to the first AD conversion circuit 43 configured in the first substrate 13. Also, it is possible to input outputs of the pixels 2 configured in the first substrate 13 to the second AD conversion circuit 44 configured in the second substrate 14.

Consequently, respective components included in the image capturing device 20 can be distributed and disposed in the first substrate 13 and the second substrate 14. Also, an area of the first substrate 13 in which the first AD conversion circuit 43 is disposed and an area of the second substrate 14 in which the second AD conversion circuit 44 is disposed can be disposed to overlap at least partially. In other words, it is possible to dispose the first AD conversion circuit 43 and the second AD conversion circuit 44 near each other.

Therefore, it is possible to shorten and approximately equalize a wiring between the first AD conversion circuit 43 and outputs of the respective columns of pixels 2 and a wiring between the second AD conversion circuit 44 and outputs of the respective columns of pixels 2. Also, it is possible to shorten and approximately equalize a wiring between the first AD conversion circuit 43 and the ramp wave generator 83 and a wiring between the second AD conversion circuit 44 and the ramp wave generator 83. Also, it is possible to shorten and approximately equalize a wiring between the first AD conversion circuit 43 and the phase shift clock generator 82 and a wiring between the second AD conversion circuit 44 and the phase shift clock generator 82. Also, it is possible to shorten and approximately equalize a wiring between the first AD conversion circuit 43 and the control circuit 81 and a wiring between the second AD conversion circuit 44 and the control circuit 81.

Consequently, without providing two ramp wave generators 83, two phase shift clock generators 82, or two control circuits 81, it is possible to prevent an increase in noise and degradation in accuracy caused by extension of a wiring. In other words, while suppressing an increase in circuit size and power consumption, it is possible to prevent an increase in noise and degradation in accuracy of AD conversion caused by a wiring.

In the image capturing device 20 according to this embodiment, the first AD conversion circuit 43 provides respective odd-numbered columns of pixels 2 with the comparators 301, 303, 305, 307, and 309, the latches 501, 503, 505, 507, and 509, and the counters 401, 403, 405, 407, and 409. Also, the second AD conversion circuit 44 provides respective even-numbered columns of pixels 2 with the comparators 312, 314, 316, 318, and 320, the latches 512, 514, 516, 518, and 520, and the counters 412, 414, 416, 418, and 420.

Consequently, in a space of two columns of pixels 2, one of the comparators 301, 303, 305, 307, 309, 312, 314, 316, 318 and 320, one of the latches 501, 503, 505, 507, 509, 512, 514, 516, 518, and 520, and one of the counters 401, 403, 405, 407, 409, 412, 414, 416, 418, and 420 are disposed, so that the layout of the first AD conversion circuit 43 and the second AD conversion circuit 44 becomes simple.

The arrangement of respective components included in the image capturing device 20 is not limited to the arrangement of FIG. 3. For example, the ramp wave generator 83, the phase shift clock generator 82, the control circuit 81, the horizontal drive section 7, or the memory 5 may be disposed on the first substrate 13. Also, the first AD conversion circuit 43 may perform AD conversion on output values of pixels 2 of even-numbered columns, and the second AD conversion circuit 44 may perform AD conversion on output values of pixels 2 of odd-numbered columns.

(Third Embodiment)

Figure 4:
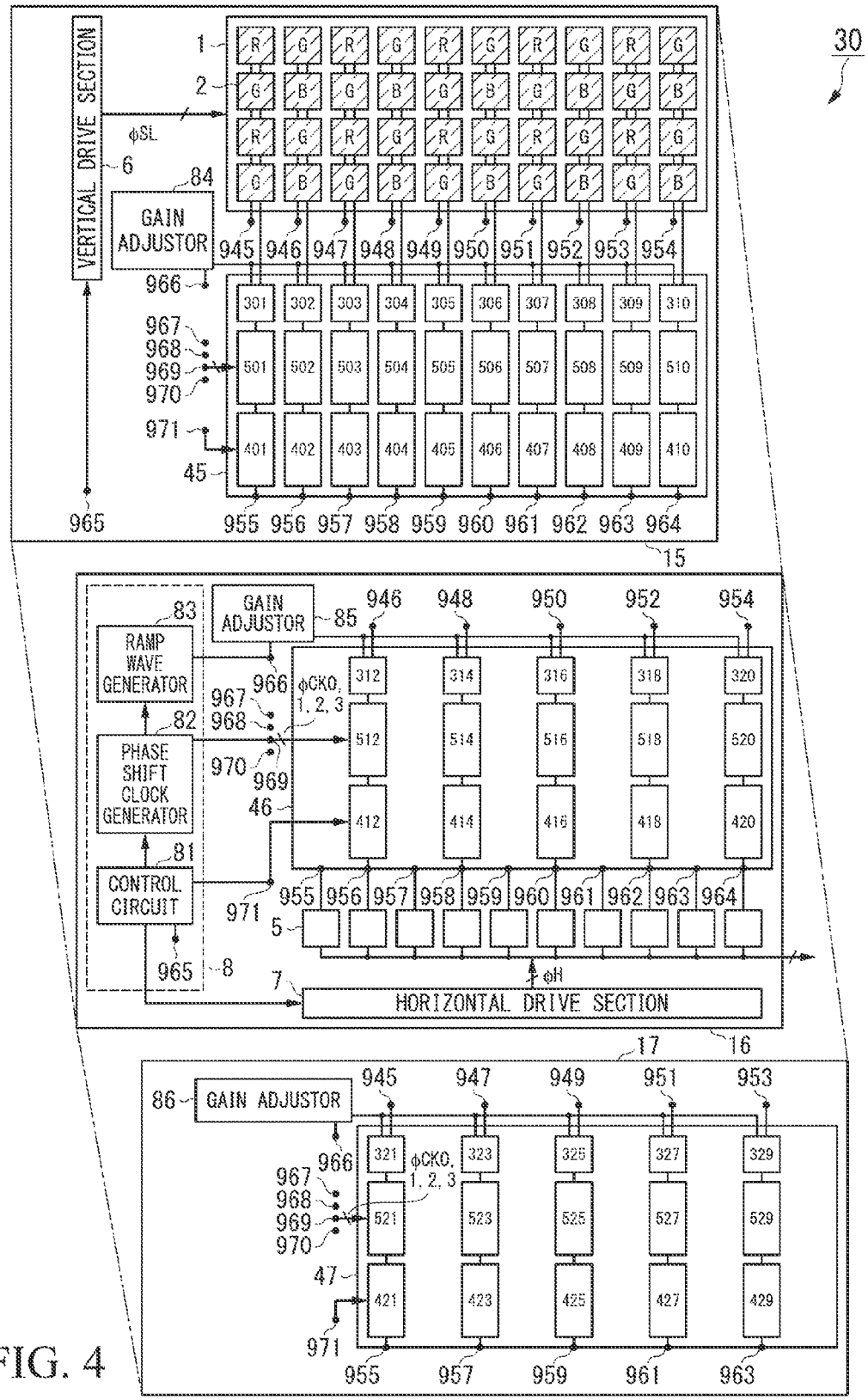
FIG. 4 is a block diagram showing a schematic configuration of an image capturing device according to a third embodiment of the present invention.
Figure 5:
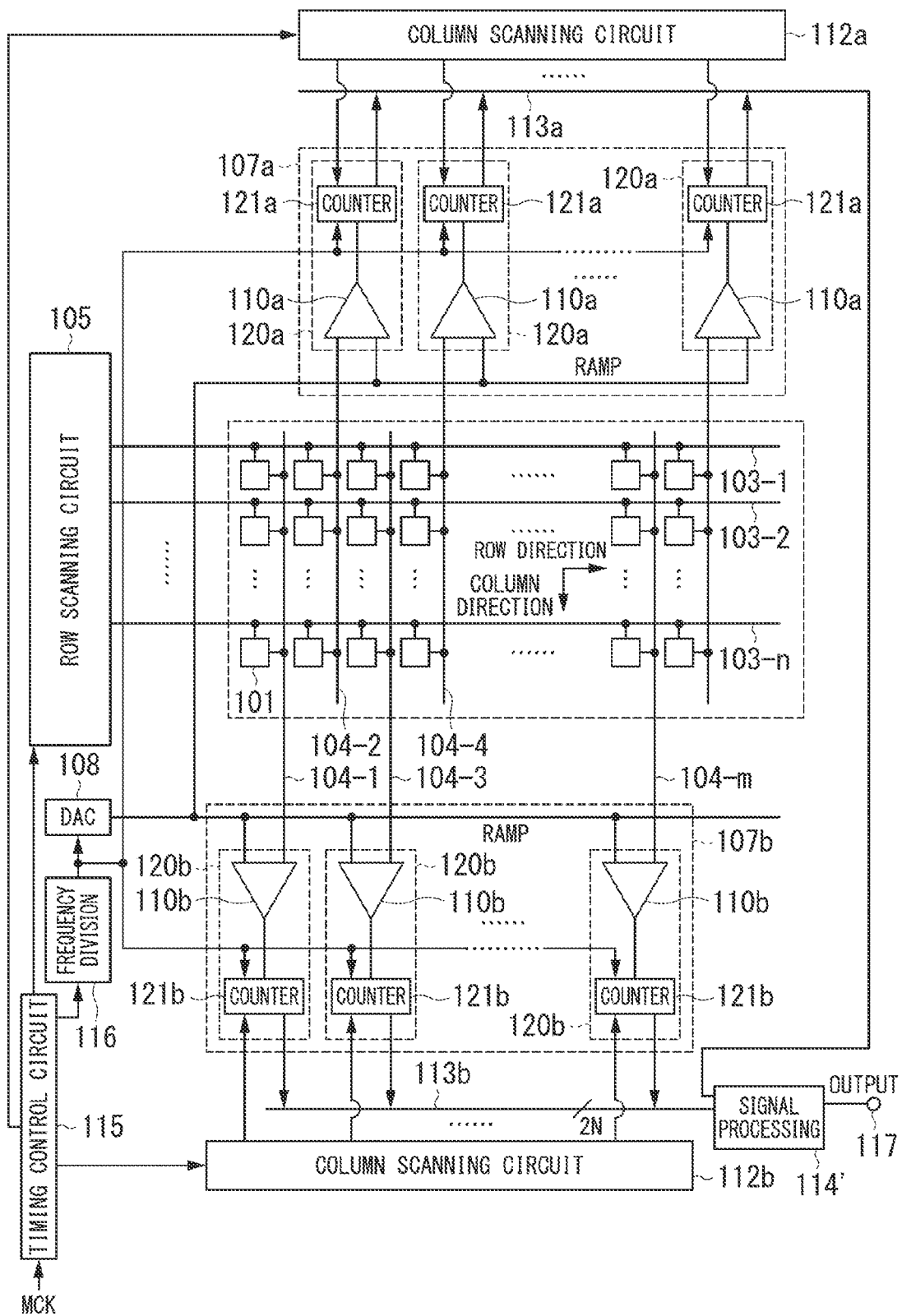
FIG. 5 is a block diagram showing a configuration of a known top-bottom read type complementary metal oxide semiconductor (CMOS) image sensor.
Figure 6:
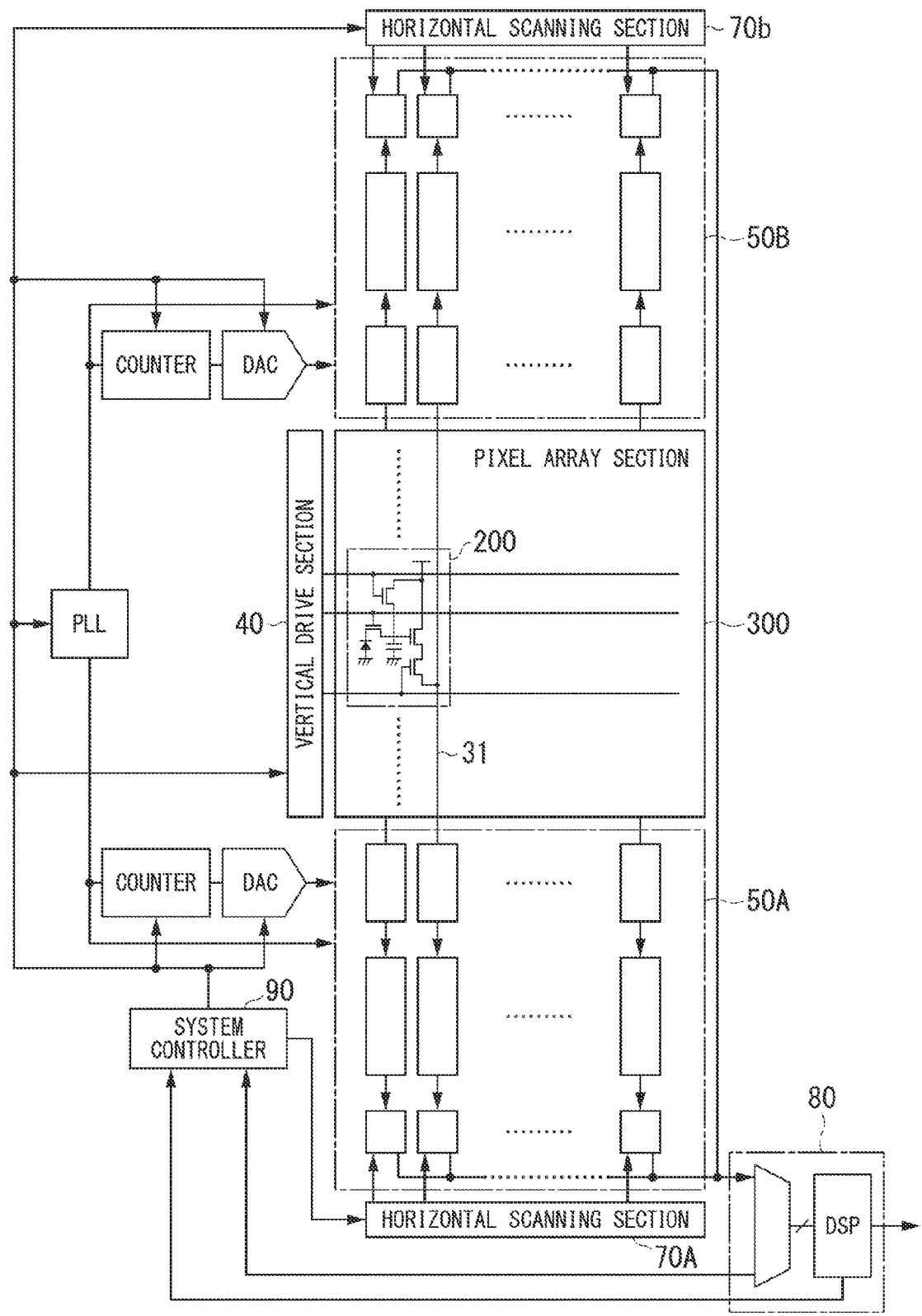
FIG. 6 is a block diagram showing a configuration of a known top-bottom read type CMOS image sensor.

Next, an image capturing device according to a third embodiment of the present invention will be described. FIG. 4 is a block diagram showing a schematic configuration of an image capturing device 30 according to this embodiment. In the example shown in the drawing, the image capturing device 30 includes a first substrate 15, a second substrate 16, and a third substrate 17 (a tertiary substrate), and the first substrate 15, the second substrate 16, and the third substrate 17 are stacked in stages. In other words, the first substrate 15, the second substrate 16, and the third substrate 17 overlap. The image capturing device 30 includes a pixel section 1 in which a total of 40 pixels 2 are disposed in a matrix form of four rows and ten columns, a first AD conversion circuit 45, a second AD conversion circuit 46, a third AD conversion circuit 47, a memory 5, a vertical drive section 6, a horizontal drive section 7, a controller 8, a gain adjustor 84, and connectors 945 to 971.

According to this embodiment, in the pixel section 1, pixels 2 (red (R) pixels) in which a color filter transmitting red light is provided, pixels 2 (green (G) pixels) in which a color filter transmitting green light is provided, and pixels 2 (blue (B) pixels) in which a color filter transmitting blue light is provided are disposed in a primary color Bayer arrangement. In the example shown in the drawing, R pixels and G pixels are alternately disposed in the first row and the third row of the pixel section 1 from the left side (first column) in sequence, and G pixels and B pixels are alternately disposed in the second row and the fourth row of the pixel section 1 from the left side in sequence.

Differences between the image capturing device 30 according to this embodiment and the image capturing device 10 according to the first embodiment are in that the third substrate 17, the third AD conversion circuit 47, and the gain adjustors 84 to 86 are provided, and color filters are provided in the pixels 2, in the configurations of the first AD conversion circuit 45 and the second AD conversion circuit 46, and in the number of connectors 945 to 971. Other configurations are the same as those of the image capturing device 10 according to the first embodiment. Therefore, only different components will be described below, and descriptions of configurations that are the same as those of the first embodiment will be omitted.

The first AD conversion circuit 45 provides the respective columns of pixels 2 with comparators 301 to 310, latches 501 to 510, and counters 401 to 410. The second AD conversion circuit 46 provides the respective even-numbered columns of pixels 2 with comparators 312, 314, 316, 318, and 320, latches 512, 514, 516, 518, and 520, and counters 412, 414, 416, 418, and 420. The third AD conversion circuit 47 provides the respective odd-numbered columns of pixels 2 with comparators 321, 323, 325, 327, and 329, latches 521, 523, 525, 527, and 529, and counters 421, 423, 425, 427, and 429.

In the first substrate 15, the pixel section 1, the first AD conversion circuit 45, the vertical drive section 6, and the gain adjustor 84 are configured. In the second substrate 16, the second AD conversion circuit 46, the memory 5, the horizontal drive section 7, the controller 8, and the gain adjustor 85 are configured. In the third substrate 17, the third AD conversion circuit 47, and the gain adjustor 86 are configured. An area of the first substrate 15 in which the first AD conversion circuit 45 is disposed, an area of the second substrate 16 in which the second AD conversion circuit 46 is disposed, and an area of the third substrate 17 in which the third AD conversion circuit 47 is disposed overlap at least partially.

The connectors 945 to 971 electrically connect the first substrate 15, the second substrate 16, and the third substrate 17. For example, the connector 945 electrically connects outputs of pixels 2 of a first column configured in the first substrate 15 and an input of the comparator 321 included in the third AD conversion circuit 47 configured in the third substrate 17. In addition, connection relationships of the connectors 946 to 971 are as shown in the drawing.

The comparators 301 to 310 included in the first AD conversion circuit 45 are configured so that output values of G pixels among pixels 2 of the corresponding columns are input. For example, the comparator 301 included in the first AD conversion circuit 45 is configured so that output values of pixels 2 which are G pixels of the first column are input. Also, the comparators 312, 314, 316, 318, and 320 included in the second AD conversion circuit 46 are configured so that output values of B pixels among pixels 2 of the corresponding even-numbered columns are input. For example, the comparator 312 included in the second AD conversion circuit 46 is configured so that output values of B pixels among pixels 2 of a second column are input. Also, the comparators 321, 323, 325, 327, and 329 included in the third AD conversion circuit 47 are configured so that output values of R pixels among pixels 2 of the corresponding odd-numbered columns are input. For example, the comparator 321 included in the third AD conversion circuit 47 is configured so that output values of R pixels among pixels 2 of the first column are input. In other words, the first AD conversion circuit 45 performs AD conversion on output values of the G pixels among the pixels 2, the second AD conversion circuit 46 performs AD conversion on output values of B pixels among the pixels 2, and the third AD conversion circuit 47 performs AD conversion on output values of R pixels among the pixels 2.

In the example shown in the drawing, the pixel section 1 includes the total of 40 pixels 2 in four rows and ten columns. However, the arrangement of pixels is not limited to this and may be any arrangement. Also, the first AD conversion circuit 45, the second AD conversion circuit 46, and the third conversion circuit 47 provide one column in which corresponding pixels 2 are disposed with one of the comparators 301 to 310, 312, 314, 316, 318, 320, 321, 323, 325, 327, and 329, one of the latches 501 to 510, 512, 514, 516, 518, 520, 521, 523, 525, 527, and 529, and one of the counters 401 to 410, 412, 414, 416, 418, 420, 421, 423, 425, 427, and 429, but the present invention is not limited to this case. The first AD conversion circuit 45, the second AD conversion circuit 46, and the third AD conversion circuit 47 may provide a plurality of corresponding columns of pixels 2 with one of the comparators 301 to 310, 312, 314, 316, 318, 320, 321, 323, 325, 327, and 329, one of the latches 501 to 510, 512, 514, 516, 518, 520, 521, 523, 525, 527, and 529, and one of the counters 401 to 410, 412, 414, 416, 418, 420, 421, 423, 425, 427, and 429, for example, two corresponding columns of pixels 2 with one comparator, one latch, and one counter, three corresponding columns of pixels 2 with one comparator, one latch, and one counter, or the like.

The gain adjustor 84 adjusts a gain of the first AD conversion circuit 45. The gain adjustor 85 adjusts a gain of the second AD conversion circuit 46. The gain adjustor 86 adjusts a gain of the third AD conversion circuit 47. Also, as described above, the first AD conversion circuit 45 performs AD conversion on output values of the G pixels among the pixels 2. The second AD conversion circuit 46 performs AD conversion on output values of the B pixels among the pixels 2. The third AD conversion circuit 47 performs AD conversion on output values of the R pixels among the pixels 2. Accordingly, it is possible to easily adjust a gain of each color filter.

In this embodiment, the first substrate 15, the second substrate 16, and the third substrate 17 are electrically connected by the connectors 945 to 971. For this reason, it is possible to input, for example, phase shift pulses $\phi CK0$, $\phi CK1$, $\phi CK2$, and $\phi CK3$ output by a phase shift clock generator 82 configured in the second substrate 16 and a ramp signal output by a ramp wave generator 83 to the first AD conversion circuit 45 configured in the first substrate 15 and the third AD conversion circuit 47 configured in the third substrate 17. Also, it is possible to input outputs of the pixels 2 configured in the first substrate 15 to the second AD conversion circuit 46 configured in the second substrate 16 and the third AD conversion circuit 47 configured in the third substrate 17.

Consequently, respective components included in the image capturing device 30 can be distributed and disposed in the first substrate 15, the second substrate 16, and the third substrate 17. Also, an area of the first substrate 15 in which the first AD conversion circuit 45 is disposed, an area of the second substrate 16 in which the second AD conversion circuit 46 is disposed, and an area of the third substrate 17 in which the third AD conversion circuit 47 is disposed can be disposed to overlap at least partially. In other words, it is possible to dispose the first AD conversion circuit 45, the second AD conversion circuit 46, and the third AD conversion circuit 47 near one another.

Therefore, it is possible to shorten and approximately equalize a wiring between the first AD conversion circuit 45 and outputs of the respective columns of pixels 2, a wiring between the second AD conversion circuit 46 and outputs of the respective columns of pixels 2, and a wiring between the third AD conversion circuit 47 and outputs of the respective columns of pixels 2. Also, it is possible to shorten and approximately equalize a wiring between the first AD conversion circuit 45 and the ramp wave generator 83, a wiring between the second AD conversion circuit 46 and the ramp wave generator 83, and a wiring between the third AD conversion circuit 47 and the ramp wave generator 83. Also, it is possible to shorten and approximately equalize a wiring between the first AD conversion circuit 45 and the phase shift clock generator 82, a wiring between the second AD conversion circuit 46 and the phase shift clock generator 82, and a wiring between the third AD conversion circuit 47 and the phase shift clock generator 82. Also, it is possible to shorten and approximately equalize a wiring between the first AD conversion circuit 45 and the control circuit 81, a wiring between the second AD conversion circuit 46 and the control circuit 81, and a wiring between the third AD conversion circuit 47 and the control circuit 81.

Consequently, without providing three ramp wave generators 83, three phase shift clock generators 82, or three control circuits 81, it is possible to prevent an increase in noise and degradation in accuracy caused by extension of a wiring. In other words, while suppressing an increase in circuit size and power consumption, it is possible to prevent an increase in noise and degradation in accuracy of AD conversion caused by a wiring.

The arrangement of respective components included in the image capturing device 30 is not limited to the arrangement of FIG. 4. For example, the ramp wave generator 83, the phase shift clock generator 82, the control circuit 81, the horizontal drive section 7, or the memory 5 may be disposed on the first substrate 15 or the third substrate 17.

Thus far, embodiments of the present invention have been described in detail with reference to the drawings. However, a detailed configuration is not limited to the embodiments, and a design and the like within a range not departing from the spirit of the present invention is also included.

The present invention can be widely applied to image capturing devices, and can prevent an increase in noise and degradation in accuracy of AD conversion caused by a wiring while suppressing an increase in the circuit size and the power consumption of an image capturing device.

What is claimed is:

1. An image capturing device in which a first substrate and a second substrate are stacked in stages, the image capturing device comprising:

a pixel section which is configured in the first substrate and in which a plurality of pixels outputting signals according to incident physical quantities are disposed in a matrix form;

a first analog-digital (AD) conversion circuit which is disposed in the first substrate for every column or every plurality of columns of pixels and performs AD conversion on signals output by at least some of the pixels;

a connector which electrically connects the first substrate and the second substrate;

a second AD conversion circuit which is disposed in the second substrate for every column or every plurality of columns of pixels and performs AD conversion on signals output by at least some of the pixels and input through the connector; and a controller which is configured in the first substrate or the second substrate and supplies a control signal to the first AD conversion circuit and the second AD conversion circuit, wherein an area of the first substrate in which the first AD conversion circuit is disposed and an area of the second substrate in which the second AD conversion circuit is disposed overlap at least partially.

2. The image capturing device according to claim 1, wherein the controller comprises a clock generator which outputs a multiphase clock signal, and the first AD conversion circuit and the second AD conversion circuit perform the AD conversion using the multiphase clock signal output by the clock generator.

3. The image capturing device according to claim 1, wherein the first AD conversion circuit performs the AD conversion on signals output by pixels of odd-numbered columns or odd-numbered pixels, or pixels of even-numbered columns or even-numbered pixels, and the second AD conversion circuit performs the AD conversion on signals output by pixels of columns different from the pixels on which the first AD conversion circuit performs the AD conversion.

4. The image capturing device according to claim 1, wherein the first AD conversion circuit performs the AD conversion on signals output by pixels of odd-numbered rows or even-numbered rows, and the second AD conversion circuit performs the AD conversion on signals output by pixels of rows different from the pixels on which the first AD conversion circuit performs the AD conversion.

5. The image capturing device according to claim 1, wherein a third substrate is stacked with the first substrate and the second substrate in stages, the connector electrically connects the first substrate, the second substrate, and the third substrate, the image capturing device further includes a third AD conversion circuit that is disposed in the third substrate for every column or every plurality of columns of pixels and performs AD conversion on signals output by at least some of the pixels and input through the connector, and an area of the first substrate in which the first AD conversion circuit is disposed, an area of the second substrate in which the second AD conversion circuit is disposed, and an area of the third substrate in which the third AD conversion circuit is disposed overlap at least partially.

6. The image capturing device according to claim 2, wherein the first AD conversion circuit performs the AD conversion on signals output by pixels of odd-numbered columns or odd-numbered pixels, or pixels of even-numbered columns or even-numbered pixels, and the second AD conversion circuit performs the AD conversion on signals output by pixels of columns different from the pixels on which the first AD conversion circuit performs the AD conversion.

7. The image capturing device according to claim 2, wherein the first AD conversion circuit performs the AD conversion on signals output by pixels of odd-numbered rows or even-numbered rows, and the second AD conversion circuit performs the AD conversion on signals output by pixels of rows different from the pixels on which the first AD conversion circuit performs the AD conversion.

* * * * *